United States Patent [19]

Cindrich et al.

[11] Patent Number: 4,794,395

[45] Date of Patent: Dec. 27, 1988

[54] PASSIVE INTERFEROMETRIC IMAGING RECEIVER SYSTEM

[75] Inventors: Ivan Cindrich, Plymouth; Walter G. Carrara, Ann Arbor; Ivan J. LaHaie, Dexter; Anthony M. Tai, Plymouth, all of Mich.

[73] Assignee: Environmental Research Institute of Mich., Ann Arbor, Mich.

[21] Appl. No.: 40,442

[22] Filed: Apr. 17, 1987

[51] Int. Cl.$^4$ .................. G01S 5/02; G01S 13/00
[52] U.S. Cl. ............................ 342/424; 342/25
[58] Field of Search .............. 342/53, 54, 424, 417, 342/25

[56] References Cited

U.S. PATENT DOCUMENTS

| | | | |
|---|---|---|---|
| 3,803,612 | 4/1974 | Alcock et al. | 342/424 |
| 3,816,834 | 6/1974 | Wilson | 342/424 |
| 3,889,267 | 6/1975 | Lucas et al. | 342/424 |
| 3,971,027 | 7/1976 | Alcock et al. | 342/424 |
| 4,136,342 | 1/1979 | Alcock et al. | 342/424 |
| 4,160,252 | 7/1979 | Lucas et al. | 342/424 |
| 4,191,957 | 3/1980 | Walker et al. | 342/190 |
| 4,450,444 | 5/1984 | Wehner et al. | 342/196 |
| 4,466,067 | 8/1984 | Fontana | 342/424 |
| 4,497,065 | 1/1985 | Tisdale et al. | 356/4 |
| 4,626,860 | 12/1986 | Tricoles et al. | 342/25 |

*Primary Examiner*—Theodore M. Blum
*Assistant Examiner*—Gregory C. Issing
*Attorney, Agent, or Firm*—Krass & Young

[57] ABSTRACT

A passive detection and imaging system employs interferometric and synthetic aperture techniques. A moving platform employs a pair of sensors which receive thermal electromagnetic radiations from an area of interest. The received signals are narrow band filtered by a bank of filters covering an extended bandwidth. Signals from similar narrow bands from different sensors are correlated. The plurality of frequencies and plurality of positions relative to the area of interest due to the platform motion enable generation of an inverse Fourier transform image which is resolvable in both azimuth and range. Separate preferred embodiments operating at microwave frequencies and optical frequencies are disclosed. An achromatic optical interferometric correlation technique is also disclosed.

30 Claims, 6 Drawing Sheets

PASSIVE INTERFEROMETRIC IMAGING RECEIVER SYSTEM

The United States government has a nonexclusive right to use this invention pursuant to contracts F33615-83-C-1046 and F33615-84-C-1508, awarded by the U.S. Air Force.

FIELD OF THE INVENTION

The present invention relates to the field of detection of objects at a distance and, in particular, to the passive detection and imaging of an object at a distance from the thermal radiation of that object using synthetic aperture techniques.

BACKGROUND OF THE INVENTION

Electromagnetic radiation has long been employed for the remote detection and identification of targets. In particular, electromagnetic radiation in the form of radar has been employed in airborne platforms for the detection and classification of targets on the ground. Synthetic aperture techniques have been employed with such airborne radar systems in order to improve the imaging capability of the relatively small antenna systems which can be mounted on moving platforms. This technique involves continuous active transmission of electromagnetic radiation and reception of returns from a target area of interest, while the platform is in motion relative to the area of interest. The motion of the platform enables the formation of a synthetic aperture which is much larger than the aperture of any actual antenna which can be carried on the moving platform. This technique thus increased the imaging capability of the sensing system on the moving platform.

Such active imaging systems have a disadvantage in a hostile combat environment. These systems must announce the presence of the moving platform by the radar transmissions necessary to form the image. The imaging system requires the detection of a returned radar echo which must travel twice the range between the moving vehicle and the area of interest. On the other hand, a receiver located within the area of interest need only detect the transmissions having come directly from the moving vehicle. Therefore, the target in the area of interest always has the advantage in detection of the moving vehicle over the chances of the synthetic aperture radar on the moving vehicle detecting the target and will generally be able to detect the sensing system on the moving platform prior to its detection by the sensing system on the moving platform. The target may be able to take evasive action to hide itself or initiate counter measures against the moving platform prior to the imaging system on the moving platform being able to detect the presence of the target. This fact means that a passive imaging system, that is a system which does not provide its own transmissions of radiation, would be highly advantageous in this environment.

SUMMARY OF THE INVENTION

The primary objective of the present invention is to provide passive imaging from a moving platform of an area of interest employing synthetic aperture techniques. The radiation employed by the passive receiver are the thermal emissions from the area of interest. In accordance with the present invention, measurements are made from at least two sensors on the moving platform simultaneously. The received radiation from the target is broken up into a plurality of narrow bandwidth signals for each of the sensors. Interference correlation measurements are made between signals of like narrow frequency bands from the two receivers. Correlation measurements are made over a short time period for each of these frequency bands. This process is repeated as the platform moves relative to the area of interest.

This data is employed to form a synthetic aperture from the various positions of the moving vehicle relative to the area of interest. The correlation measurements at the various narrow frequency bands at the various positions of the moving vehicle enable the generation of an inverse Fourier transform of the intensity distribution of the area of interest defined by the field of view of the antennas for producing an image of the area of interest. In producing this inverse Fourier transform, the correlation data on the received signals is organized in a polar coordinate format. In this polar coordinate format the angular part corresponds to the angle between the area of interest and the moving platform as the data is received. The radial part corresponds to the frequency band at which the correlation measurements are taken, with zero Hertz being at the origin. Organizing the received data in this manner enables better calculation of the image of the area of interest. This calculated image of the area of interest permits resolution of the area of interest in both angle and in slant range.

Three preferred embodiments of the passive interferometric imaging receiver of the present invention are described. In a first embodiment, a pair of microwave heterodyne receivers are employed. The second and third of these preferred embodiments employ either infrared or visible optical emissions by the target. In the second preferred embodiment, this infrared optical emission is received and processed in an optical heterodyne receiver. In the last of these preferred embodiments, the correlation of various frequency bands from the two sensors is formed employing a grating interferometer.

BRIEF DESCRIPTION OF THE DRAWINGS

These and other objects and aspects of the present invention will become clear from the study of the foregoing description of the invention together with the drawings in which.

DETAILED DESCRIPTION OF THE PREFERRED EMBODIMENTS

Figure 1:
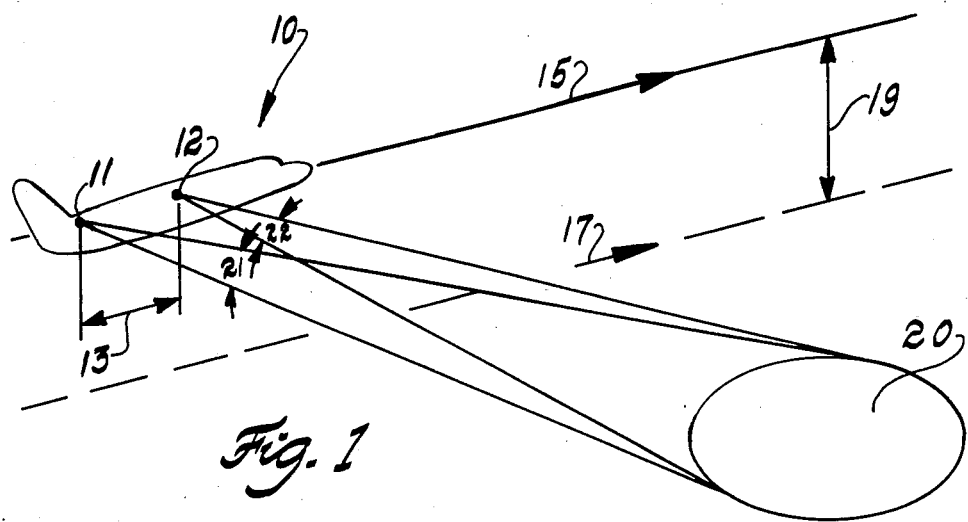
FIG. 1 illustrates the typical relationship of the sensors mounted on the moving vehicle to the area of interest.

FIG. 1 is an illustration of a typical case of the moving vehicle 10 in relationship to the area of interest 20. Sensors 11 and 12 are mounted on moving vehicle 10, separated by a distance 13. Moving vehicle 10 is traveling on a line 15 corresponding to a ground path 17. During this flight, vehicle 10 maintains a height 19 above the ground.

Sensor 11 includes a beam width 21. Similarly, sensor 12 includes a beam width 22. During the flight, each of these beams are directed to the area of interest 20. That is, if the sensors 11 and 12 have any directivity, their main response is continually trained upon area of interest 20 regardless of the particular angle made with respect to the flight path 15 of vehicle 10. In addition, in accordance with the principles of synthetic aperture beam forming, a variable delay is imposed in the receiver connected to one or both of sensors 11 and 12 in order to ensure that the main lobe of the response of the pair of sensors together is also always directed at the area of interest 20.

Figure 2:
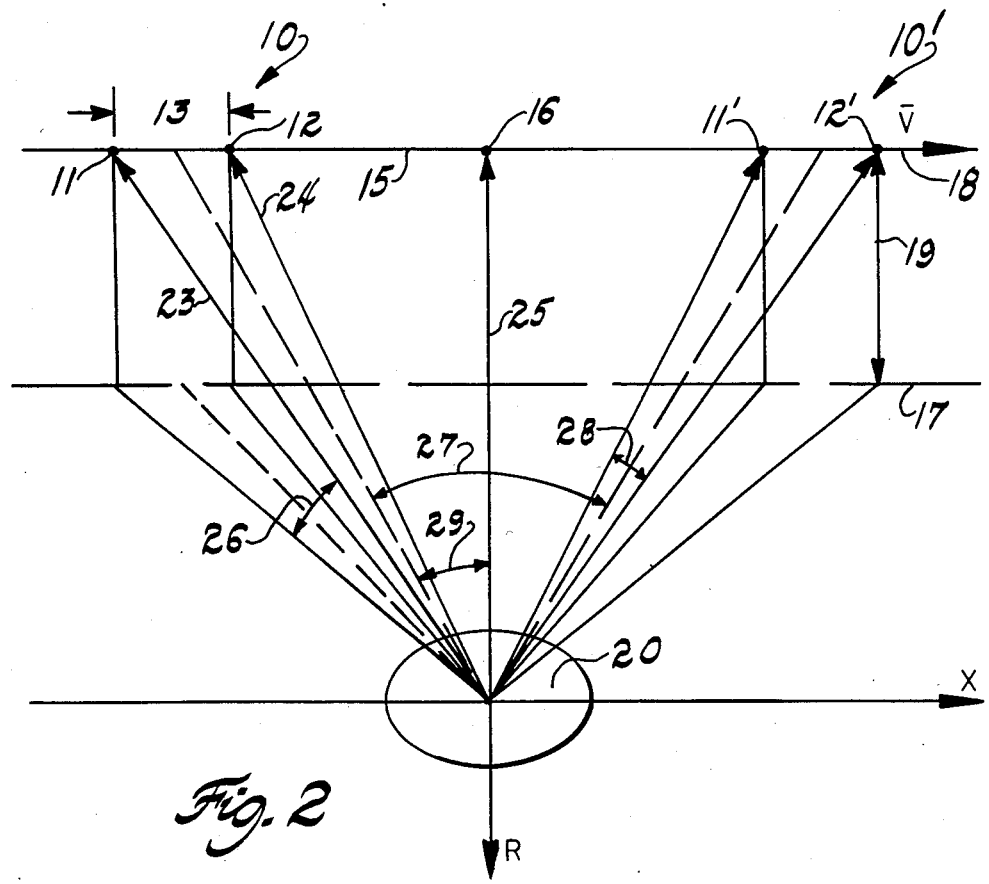
FIG. 2 illustrates the definitions of various quantities employed in the technical description of the operation of the present invention.

FIG. 2 illustrates the definition of some quantities employed in the theoretical discussion of the operation of the present invention. The distance 13 between sensors 11 and 12 is designated s. FIG. 2 illustrates a coordinate system having its origin at the center of the area of interest 20. The total surface area of the area of interest 20 is designated as S. The vector 23 from this origin to the position of sensor 11 is designated $\bar{r}_1$. Similarly, the vector 24 from the origin to the position of sensor 12 is designated $\bar{r}_2$. The vector 25 between the origin and the minimum point 16 closest to the origin in the flight path 15 is designated $\bar{r}_0$.

Various angles are also designated in the definitions of FIG. 2. The angle 26 between the horizontal and the vector from the origin to one of the sensor positions is $\gamma$. The total angle 27 subtended by the initial and final positions of vehicle 10 during an individual measurement is designated $\Delta\theta$. The angle 28 made between the vector from the origin to sensor 11 and the vector from the origin to sensor 12 is designated $\alpha$. Lastly, the angle 29 from a reference line passing through the origin to the current angular position of vehicle 10 is designated $\theta$.

Assume that each point within the area of interest 20 emits thermal radiation characterized by a scalar source on its surface. Let the source be designated by the function $U_s(\bar{r}', f)$ at the position vector $\bar{r}'$ of the scene and at the temporal frequency f. According to the standard diffraction theory, the field $U(\bar{r},f)$ at the distance point R is given by $$U(\bar{r},f) = \frac{i}{\lambda r} e^{i2\pi \frac{f}{c} r} \int_S U(\bar{r}',f) e^{-i2\pi \frac{f}{c} \hat{r}\cdot\bar{r}'} d\bar{r}' \qquad (1)$$

Where $\bar{r} = r\cdot\hat{r}$, with $\hat{r}$ being a unit vector.
S = the surface of the scene.
c = the speed of light, and
$\lambda$ = the wavelength.

It is next assumed that the frequency dependence of the source over all frequencies of interest is independent of the source position vector $\bar{r}'$, therefore $$U_s(\bar{r}',f) = U_0(\bar{r}')S(f) \qquad (2)$$

Substituting equation (2) into equation (1) we find $$U(\bar{r},f) = \frac{i}{\lambda r} e^{i2\pi \frac{f}{c} r} S(f) \int_S U_0(\bar{r}') e^{-i2\pi \frac{f}{c} \hat{r}\cdot\bar{r}'} d\bar{r}' \qquad (3)$$

This result indicates that the field $U(\bar{r},f)$ is simply a weighted version of the three-dimensional spatial Fourier transform of the object source distribution $U_0(\bar{r}')$, evaluated at the spatial frequency point $$\bar{F} = \frac{f}{c} \hat{r} \qquad (4)$$

Thus, it would appear that the source distribution could be reconstructed by measuring the field $U(\bar{r},f)$ for a variety of temporal frequencies f and a variety of vectors $\bar{r}$. However, in the thermal radiations of interest in the present application, the source emission $U_s(\bar{r}',f)$ and hence the distant field $U(\bar{r},f)$ are random functions of position and frequency. Thus, direct measurement of this quantity is not very meaningful. A more desirable measure would be a measure of some stable statistical parameter over the scene, such as its average radiated power at point $\bar{r}'$ over a limited frequency region. Consider the second order correlation function of the field $U(\bar{r},f)$ given by $$R(\bar{r}_1,\bar{r}_2;f) = \langle U(\bar{r}_1,f), U(\bar{r}_2,f) \rangle \qquad (5)$$

where $\langle \cdot \rangle$ denotes the average over the ensemble of all source realizations. This function $R(\bar{r}_1,\bar{r}_2;f)$ is the cross correlation of the fields at the two points $\bar{r}_1$ and $\bar{r}_2$. By substitution of equation (3) into equation (5) we find $$R(\bar{r}_1,\bar{r}_2;f) = \frac{e^{i2\pi \frac{f}{c}(r_1-r_2)}}{\lambda^2 \cdot r_1 \cdot r_2} |S(f)|^2 * \qquad (6)$$

$$\int_{S_1}\int_{S_2} \langle U_0(\bar{r}_1') U(\bar{r}_2') \rangle e^{-i2\pi \frac{f}{c}(\hat{r}_1\cdot\bar{r}_1' - \hat{r}_2\cdot\bar{r}_2')} d\bar{r}_1' d\bar{r}_2'$$

For thermal emissions we assume that the field $U_0$ to be spatially incoherent. That is, $$\langle U_0(\bar{r}_2')U_0^*(\bar{r}_2')\rangle = I_0(\bar{r}_1')\delta(\bar{r}_1' - \bar{r}_2') \qquad (7)$$

where $I_0(\bar{r}'_1)$ is the average radiated power per unit area, that is the source intensity. Substituting equation (7) into equation (8), integrating over $\bar{r}'_2$ and replacing $\bar{r}'_1$ by $\bar{r}'$ yields $$R(\bar{r}_1,\bar{r}_2;f) = R_0(\bar{f}) = \frac{e^{i2\pi \frac{f}{c}(r_1-r_2)}}{\lambda^2 \cdot r_1 \cdot r_2} |S(f)|^2 * \qquad (8)$$

$$\int_S I_0(\bar{r}') e^{-i2\pi \frac{f}{c}(\hat{r}_1-\hat{r}_2)\cdot\bar{r}'} d\bar{r}'$$

This expression indicates the the cross-correlation of the radiated fields at the two points $\bar{r}_1$ and $\bar{r}_2$ is equal to the weighted three-dimensional spatial Fourier transform of the average source intensity evaluated at the spatial frequency point $$\bar{F} = \frac{f}{c}(\hat{r}_1 - \hat{r}_2) = \frac{f}{c}\sin\frac{\alpha}{2}\hat{F} \quad (9)$$

where F is a unit vector directed from $\hat{r}_1$ to $\hat{r}_2$.

In order to develop a well resolved image of the source intensity $I_0$, it is necessary to measure $R_0$ over a suitably filled aperture in the Fourier space characterized by the spatial frequency vector $\bar{F}$. From equation (9) it is clear that the aperture fill can be obtained by varying both the temporal frequency f and the measurement geometry via $r_1$ and $r_2$, that is by moving the sensors.

Using the geometry illustrated in FIG. 1 and the definitions illustrated in FIG. 2, a practical method for realizing this passive imaging will now be disclosed. Firstly, the pair of sensors 11 and 12 are each coupled to receivers having banks of corresponding narrow band filters. The filters are sufficiently narrow so that their output can be assumed to represent the field $U(\bar{r}_i, f_m)$ for i=1 or 2 where m is an index over the filters of the filter bank. The sensors move with a common velocity V in a direction parallel to their vector separation (see FIG. 1). The outputs of the filters are sampled at uniformly spaced instances over a time interval T corresponding to different positions $\bar{r}_{1n}, \bar{r}_{2n}$ of the sensors. In this case, n is an index over the time samples. At each time sampled interval, the outputs of the corresponding filters from the two sensors are correlated to produce data samples.

$$R_0(\bar{f}_{mn}) = \langle U(\bar{r}_{1n}, f_m) U^*(\bar{r}_{2n}, f_m) \rangle \quad (10)$$

where $$\bar{f}_{mn} = \frac{f_{mn}}{c}(\bar{r}_{1n} - \bar{r}_{2n}) \quad (11)$$

In accordance with the coordinate system best illustrated in FIG. 2, assume that the polar angle $\theta$ is in the slant range plane such that $\theta = 0$ corresponds to the broadside condition. In this case, $\Delta\theta$ is the total rotation during the synthetic aperture time T. In this case, for a particular sample value $f_m$ and $\theta_n$, FIG. 2 defines $$\bar{f}_{mn} = \frac{2f_m}{c}\sin\frac{\alpha}{2}(\hat{f}_x\cos\theta_n + \hat{f}_r\sin\theta_n) \quad (12)$$

where $\hat{f}_x$ is a unit vector in the Fourier plane parallel to the azimuth direction X illustrated in FIG. 2 and $\hat{f}_r$ is unit vector in the slant-range plane parallel to the slant-range direction R illustrated in FIG. 2.

Figure 3:
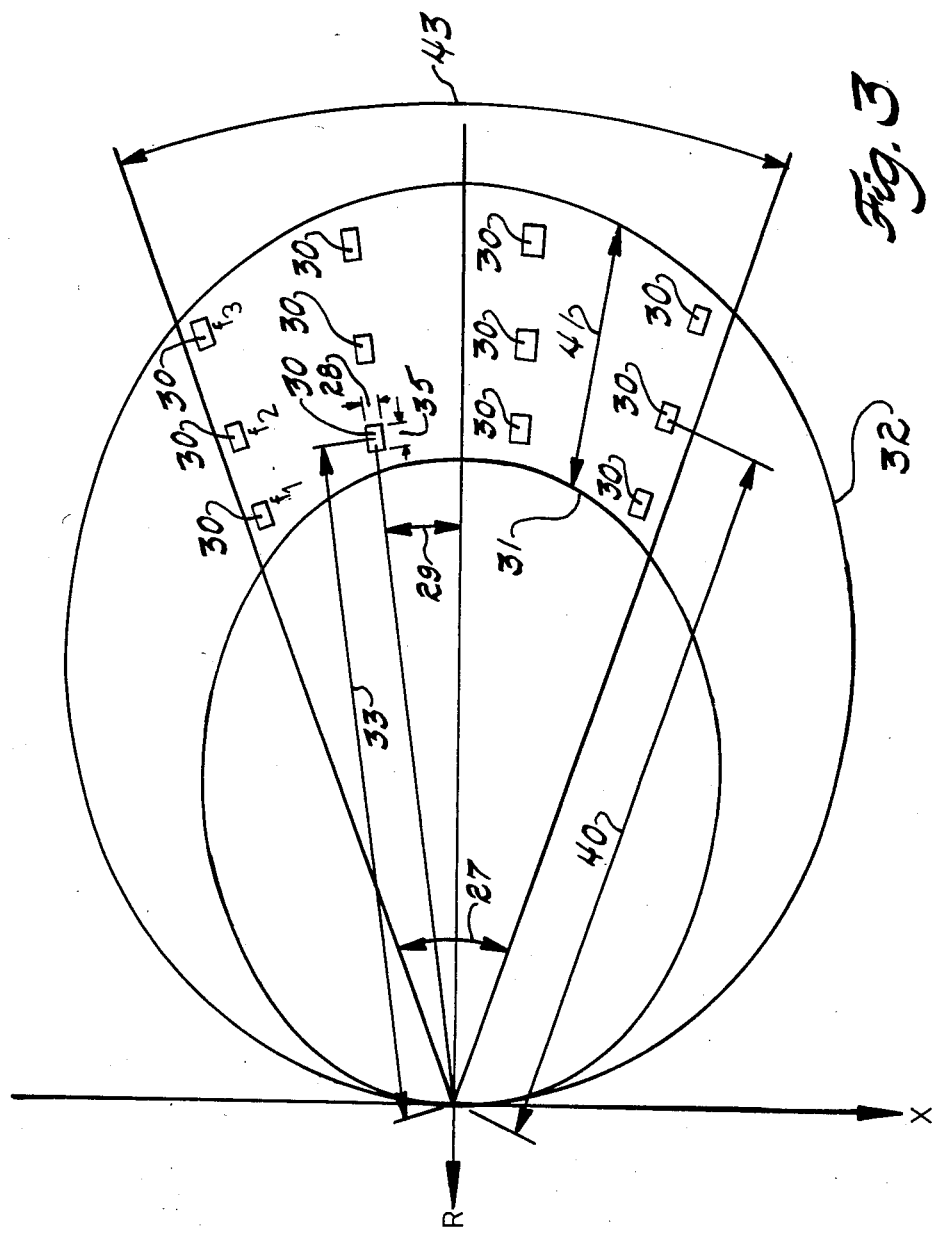
FIG. 3 illustrates the dimensions in a polar coordinate image space of correlation measurement and further illustrates the aperture filling corresponding to the correlation measurement at a plurality of frequencies at a plurality of positions in accordance with the principles of the present invention.

FIG. 3 illustrates a measured portion 31 of the possible Fourier portion 32 corresponding to a straight line fly by of an area of interest for a particular total bandwidth. The projection of individual measurements on the Fourier plane is illustrated in FIG. 3 at regions 30. Angle 29, distance 33 and dimensions 28 and 35 are illustrated for a typical region 30. Angle 29 corresponds to $\theta$ which is the angle from the midpoint between the sensors and the reference direction in the slant plane. The distance 33 corresponds to the center frequency of the bandwidth $f_m$. The dimension 28 corresponds to the angle subtended by the moving platform 10 during the interval of integration T. The width dimension 35 corresponds to the band width of the narrow band filters defining $f_m$. Together these measurements form a region 30 appearing in the Fourier plane as illustrated.

A study of Equation 12 will indicate that varying the temporal frequency $f_m$ changes only the magnitude of $f_{mn}$. Thus, measurements over a plurality of temperal frequencies about a central frequency produces a radial segment in the Fourier ($f_x$, $f_r$) plane making an angle $\theta_n$ with the $f_x$ axis offset a distance 40 from the origin. By changing the angle $\theta_n$ this line segment is rotated in the Fourier plane. The fill due to rotation through an angle $\Delta\theta$ (27) is shown in FIG. 3 as portion 31. Sufficient data can be collected for image resolution of the area of interest by presenting enough narrow bandwidths having a large enough band coverage 41 and a sufficient rotation angle 27, corresponding to the movement of the moving vehicle.

The length of the segment 41 ($B_x$) based upon a temporal bandwidth B is $$B_x = \frac{2B}{c}\sin\frac{\alpha}{2} \quad (13)$$

The slant range extent 43 ($B_R$) can be approximated by $$B_r = 2f_0\sin\frac{\Delta\theta}{2} \quad (14)$$

assuming that $\Delta\theta$ is sufficiently small. From elementary Fourier transform principles, the ground plane resolutions in azimuth and range can thus be approximated from these quantities. The azimuth resolution $\rho_x$, that is the size in azimuth of the smallest resolvable feature, is given as $$\rho_x \approx \frac{1}{B_x} = \frac{c}{2B\sin\frac{\alpha}{2}} \quad (15)$$

and the range resolution $\rho_r$, the smallest resolvable feature in range, is given as $$\rho_r \approx \frac{1}{B_r \cos} = \frac{c}{4\sin\frac{\alpha}{2}\sin\frac{\theta}{2}\cos} \quad (16)$$

where the factor $\cos\gamma$ accounts for the transformation from slant range to ground range coordinates and $f_0$ (Equation 14) is given by the formula $$f_c = \frac{2f_c}{c}\sin\frac{\alpha}{2} = \frac{2}{\lambda_c}\sin\frac{\alpha}{2} \quad (17)$$

and where $\lambda_c$ is the center wavelength of the bank of narrow band filters. For small values of $\Delta\theta$ and $\alpha$ the following approximations can be made.

$$2\sin\frac{\alpha}{2} \approx \frac{S}{r_0} \quad (18)$$

$$2\sin\frac{\Delta\theta}{2} \approx \frac{VT}{r_0} \quad (19)$$

Using these expressions, we get final expressions for the system resolution.

$$\rho_x = \frac{cr_o}{SB} \quad (20)$$

$$\rho_x = \frac{\lambda_c r_o^2}{SVT \cos} \quad (21)$$

Thus, it can be seen that better along track or azimuth resolution is achieved through temporal bandwidth, because the azimuth resolution is inversely proportional to the temporal bandwidth. On the other hand, better crosstrack or range resolution is achieved by effective rotation of the scene, that is by synthetic aperture effects. This is because the range resolution is inversely proportional to the product of the velocity and the averaging time and thus inversely proportional to the rotation angle $\Delta\theta$.

Figure 5:
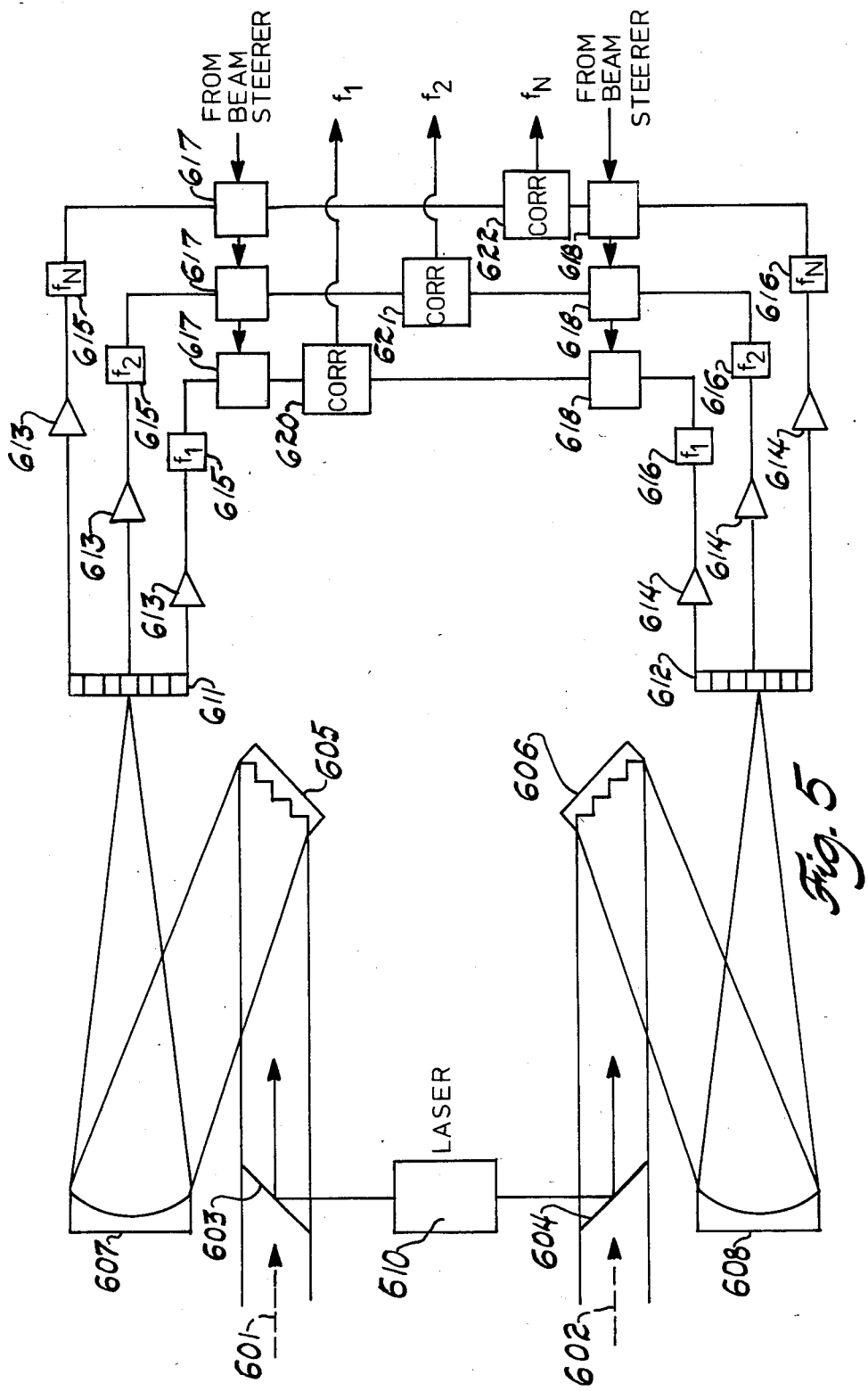
FIG. 5 illustrates the major parts of an optical heterodyne receiver constructed in accordance with a second preferred embodiment of the present invention.

FIG. 5 illustrates a microwave heterodyne receiver which can be employed to practice the present invention. Microwave heterodyne receiver 500 includes a front end RF receiving amplifier, a set of filter banks, a correlator and an integrator for each pair of filters, and post-processing apparatus for generating the image of the area of interest for display or further processing.

Microwave heterodyne receiver 500 includes two receivers, one connected to each of the two sensors 11 and 12. Sensor 11 is coupled to RF front end 501 which is further coupled to mixer/IF stage 503. Likewise, sensor 12 is connected to RF front end 502 and further connected to mixer/IF stage 504. A single local oscillator 505 provides a local oscillator signal to each of the mixer/IF stages 503 and 504. In accordance with well-known principles, the respective outputs of mixer/IF stages 503 and 504 have frequencies differing from the originally received frequencies by the frequency of the local oscillator. In the preferred embodiment, this output frequency is the lower of the two difference frequencies.

Microwave heterodyne receiver 500 includes a pair of filter banks 507 and 508. Filter bank 507 is connected to mixer/IF stage 503. Filter bank 507 includes a plurality of narrow bandpass filters having differing pass bands. Bandpass filter 511 has a center frequency $f_1$. Bandpass filter 513 has a center frequency $f_2$. Lastly, bandpass filter 515 has a center frequency of $f_N$. In a similar fashion, filter bank 508 is connected to the output of mixer/IF stage 504. Filter bank 508 includes bandpass filter 512 having center frequency $f_1$, bandpass filter 514 having center frequency $f_2$ and bandpass filter 516 having center frequency $f_N$. It should be noted that the filter banks 507 and 508 include narrow band filters covering the same frequency bands. This enables the computation of the correlation at a single frequency as required in order to solve equation (5).

The number of differing narrow bandpass filters in each of the filter bands 507 and 508 can be determined by the desired azimuth resolution. In accordance with equation (19), it is seen that the azimuth resolution $\rho_x$, that is the size of the smallest feature which can be resolved by the imaging system, is inversely proportional to the total bandwidth B. A large total bandwidth B is achieved by employing a large number of narrow band filters within each filter bank. Thus, resolution of finer features within the area of interest is achieved by employing a greater number of narrow bandpass filters. Therefore, there is a tradeoff between the amount of hardware employed in the filter bank, correlation, integration and inverse Fourier transform functions and the fineness of the resolution capability for a given scene size.

Because the output of the narrow bandpass filters appearing in each of the two filter banks 507 and 508 are similar, only a typical example of the circuits is illustrated in FIG. 5. The output of narrow bandpass filter 511 is applied to variable time delay device 521. In a similar fashion, the output of narrow bandpass filter 512, which has the same center frequency $f_1$, is coupled to time delay circuit 522. The time delay of these two variable time delay circuits is controlled in a manner which will be more fully explained below. The outputs of the variable time delay circuits 521 and 522 are applied to correlator circuit 525. Correlator circuit 525 forms the cross-correlation between these two received signals, one signal received on sensor 11 and one signal received on sensor 12. The output of correlator circuit 525 is applied to integrator 526. Integrator 526 forms successive integrations of the correlation output signal over the time interval T.

Polar domain formatting circuit 530 translates the data into the proper polar domain representation as illustrated in FIG. 3. Polar domain formatting circuit 530 receives the output of integrator 526 plus the outputs of other integrators corresponding to other pairs of filters within filter banks 507 and 508. Polar domain formatting circuit 530 also receives a position signal from position indicator 531. Position indicator 531 detects and indicates the position of the moving platform relative to the area of interest. This data corresponding to the geometry between the moving platform and the area of interest is necessary in order to provide the proper polar domain formatting of the correlation data. Position indicator 531 may be either manual or automatic. In a manual mode, position indicator 531 receives inputs on the relative position of the area of interest by an operator who continuously trains a pointer to the area of interest. In the alternative, some form of automatic computation of the relative position of the moving vehicle and the area of interest may be employed. For example, assume a straight line track with a minimum range $R_o$, a distance A from the moving platform to the point of minimum range 16. Then the boresight angle $\phi$ (where $\phi=0°$ is along the line of motion and $\phi=90°$ is broadside) is arctan $(R_o/A)$. Note that for a very large distance A, $\phi$ approaches 0°, and for small distance A, approaches 90°.

The position indicated by position indicator 531 is also applied to a beam steerer 532. Beam steerer 532 controls the delay of variable time delay circuits 521 and 522. In accordance with well-known principles of synthetic aperture antennas, the time delays of variable time delay circuits 521 and 522 are controlled in order that the wavefront from the area of interest received on the separate sensors 11 and 12 arrive at correlator 525 simultaneously. This serves to steer the main lobe of the response of the synthetic aperture antenna including the two sensors 11 and 12 toward the area of interest. In addition, an output from beam steerer 532 is employed in antenna steering. In the event that sensors 11 and 12 are not unidirectional, this signal is employed to steer the main response of the individual antennas to the area of interest. Thus, the position information from position indicator 531 is employed by beam steerer 532 to steer the main lobe of the response of the synthetic aperture antenna formed by sensors 11 and 12 toward the object of interest. It should be noted that this beam direction will change based upon the relative positions of the moving vehicle 10 and the area of interest 20.

The polar domain formatted data is coupled to two-dimensional Fourier transform circuit 540. Two-dimensional Fourier transform circuit 540 performs a two-dimensional Fourier transform on the polar formatted correlation data and thus generates an image of the area of interest 20. This image is made from the thermal radiation of the area of interest 20 and is an indication of the average radiated power for each unit area that can be resolved by the imaging system. This image may be applied to display 550 where it can be viewed by an operator. This image data may also be applied to feature detector 560 which searches the data to detect a particular feature within the area of interest 20. In addition, other types of post-processing functions may be performed on the image produced by two-dimensional Fourier transform circuit 540.

FIG. 5 illustrates optical heterodyne receiver 600 according to a second embodiment of the present invention. Optical heterodyne receiver 600 includes an optical portion for receiving and heterodyning the received infrared or visible light and an electrical portion for filtering the heterodyne signal and a correlator/integrator section which generates the correlation output of the receiver. The present description refers to the preferred embodiment employing infrared light, however the optical hetrodyne receiver can also be employed using visible light.

Optical hetrodyne receiver 600 receives infrared light in the form of rays 601 and 602. Rays 601 and 602, each received from the area of interest, are directed to respective beam combiners 603 and 604.

Laser 610 produces a pair of identical local oscillator signals which are then applied to the beam combiners 603 and 604. Beam combiner 603 permits rays 601 to pass therethrough while reflecting the local oscillation signal from laser 610. The second local oscillator signal is combined with rays 602 in a similar beam combiner 604 placed in the path of rays 602.

A major area of concern in optical systems such as illustrated in FIG. 5 is the technique for implementing multiple frequency measurements over the total bandwidth B required to achieve the desired azimuth resolution. There exist two principle approaches for obtaining samples of the received spectrum across the bandwidth B: optical and electronic filtering. They can be used separately or combined in a hybrid architecture. Their use is driven by the extent of B, the number of filters (sample density) required, and the individual filter bandwidth of each filter. In general, optical filtering techniques can provide widely spaced frequency samples of relatively large bandwidth compared to electronic filtering, which is more capable of generating closely spaced filters of narrow bandwidth. There are advantages and disadvantages associated with each of these characteristics, and hence the hybrid approach may prove to be the most optimum. Such a hybrid approach is illustrated in FIG. 5.

In many applications the required azimuth resolution results in extremely large values for the total bandwidth B, much larger than response times of available detectors. Hence, purely electronic filtering about a single local oscillator spectral line is not feasible, and optical filtering techniques are required. Several methods for optical filtering are described below.

The P-branch for the 10.4 micron spectral band of a $CO_2$ laser as shown in Table 1 indicates that a 5 percent bandwith can be provided using this branch. It is important to note that these laser lines are accessible one at a time through grating and cavity length tuning. If it is desired to obtain lasing action simultaneously on a multitude of lines special techniques may be required.

TABLE 1

| P-Branch Lasing Lines for $CO_2$ $P00^*1-10^*0$ | |
|---|---|
| Rotational Line | Wavelength |
| (4) | 10.441 |
| (6) | 10.453 |
| (8) | 10.476 |
| (10) | 10.476 |
| (12) | 10.513 |
| (14) | 10.532 |
| (16) | 10.551 |
| (18) | 10.571 |
| (20) | 10.591 |
| (22) | 10.611 |
| (24) | 10.632 |
| (26) | 10.653 |
| (28) | 10.674 |
| (30) | 10.696 |
| (32) | 10.718 |
| (34) | 10.741 |
| (36) | 10.763 |
| (38) | 10.787 |
| (40) | 10.810 |
| (42) | 10.834 |
| (44) | 10.858 |
| (46) | 10.883 |
| (48) | 10.908 |

FIG. 5 illustrates a hybrid optical electronic system for separation of bands to achieve the desired azimuth resolution. The light from beam combiner 603 (including rays 601 received from the area of interest and a local oscillator signal from laser 610) is directed to a diffraction grating 605. The local oscillator signal from laser 610 is assumed to possess multiple simultaneous laser lines or to rapidly scan multiple laser lines in the desired spectral region. Light reflected from diffraction grating 605 falls on mirror 607 and is focussed upon linear detector array 611. Diffraction grating 605 causes differing angles of reflection for the differing laser lines of laser 610. This causes the differing hererodyne signals between incoming rays 601 and the multiple laser lines of laser 610 to be dispersed along linear array detector 611. Thus each detector of detector array 611 receives a separate band hetrodyne signal corresponding to one of the laser lines of laser 610. Similarly, diffraction grating 606 disperses heterodyne signals corresponding to the multiple laser lines along liner detector array 612.

Figure 4:
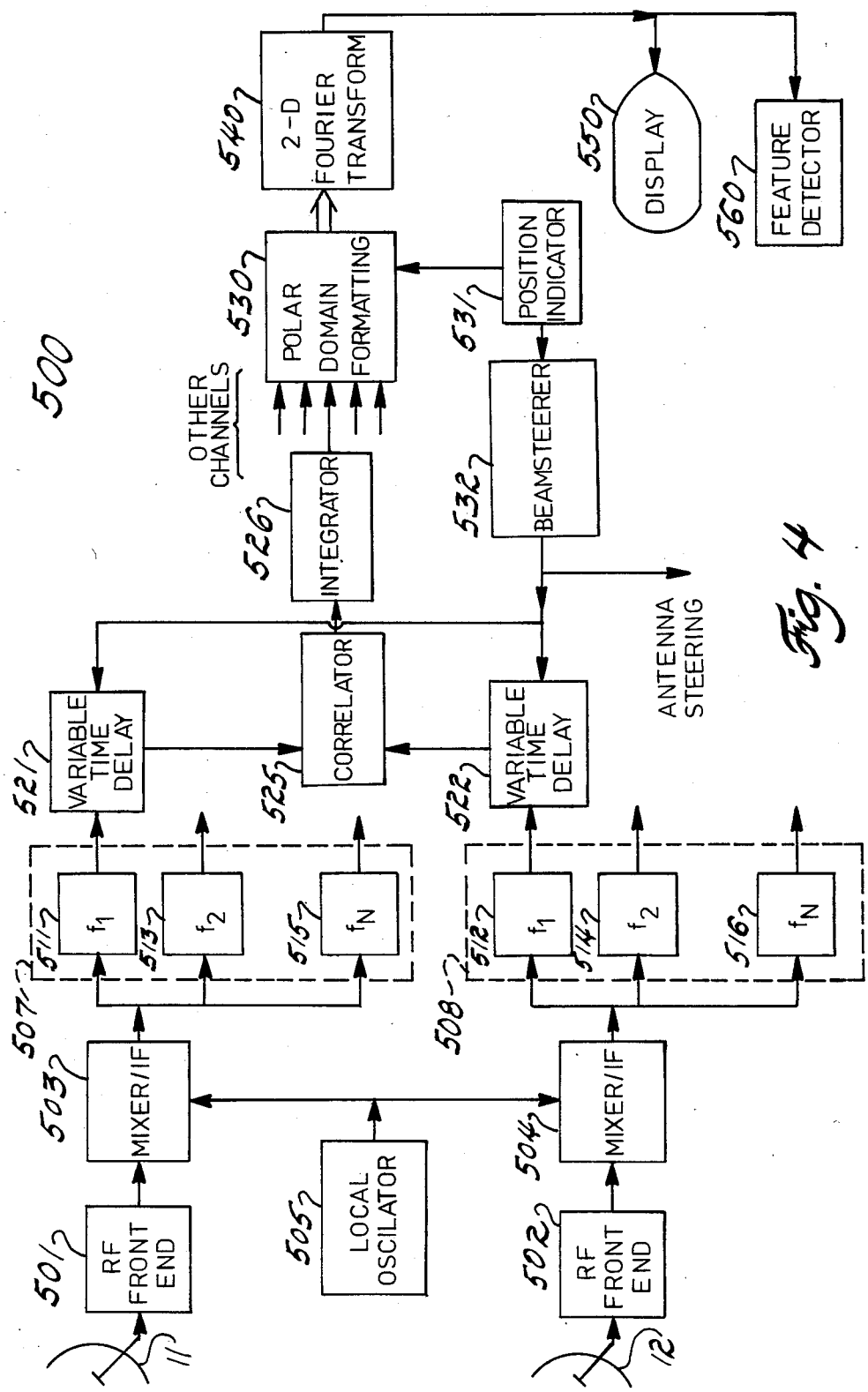
FIG. 4 illustrates the major parts of a microwave heterodyne receiver constructed in accordance with one preferred embodiment of the present invention.

The outputs from the individual detectors of linear detector arrays 611 and 612 are processed electronically. The output of each detector of linear detector array 611 is applied to the input of an amplifier 613, filtered by a bandpass filter 615 and provided a controlled delay via variable time delay circuit 617. Although there are a plurality of detectors in linear detector array 611, the circuits connected to only three detectors are illustrated for the sake of clarity. Each detector of linear detector array 612 is similarly connected to an amplifier 614, a bandpass filter 616 and a variable time delay circuit 618. The outputs of each variable delay circuit 617 and its corresponding variable delay circuit 618 are applied to a correlation circuit 620. The output of the correlation circuits 620 are applied to integrators such as integration 526 illustrated in FIG. 4. The integrated signals are processed in the same manner as illustrated in FIG. 4 through a polar domain formatter and a two dimension fourier transform circuit to generate an image of the area of interest. It should also be noted that the delays of variable time delay circuits 617 and 618 are controlled to achieve beamsteering in a manner described above in conjunction with FIG. 4.

Although large bandwidth coverage can be achieved by resorting to the many available laser lines as discussed above, alternate techniques may indeed be possible. In particular, B may be made small enough (on the order of several GHz), so that a single laser line from the $CO_2$ local oscillator will suffice and the multiplicity of channels is achieved using a bank of electronic filters. Each filter interrogates a different spectral region of the thermal emission in the vicinity of the local oscillator frequency.

Even if B cannot be decreased to the point of allowing only electronic filtering, moderate values can be achieved optically by frequency sweeping a $CO_2$ laser using internal or external cavity modulation techniques. The bandwidth achievable would correspond to the free spectral range of the laser cavity. The use of multiple laser lines and/or cavity modulation of a single line will constitute the primary design approachs to the multiple frequency measurement problem, depending on the anticipated baseline separation.

An alternative approach to be considered is the use of tunable lead-salt cryogenic laser diodes. A moderate bandwidth is achievable using combined temperature and electronic tuning. These methods are less advantageous than the techniques described above because they are probably too slow to adequately meet the passible imaging system requirements.

Figure 6:
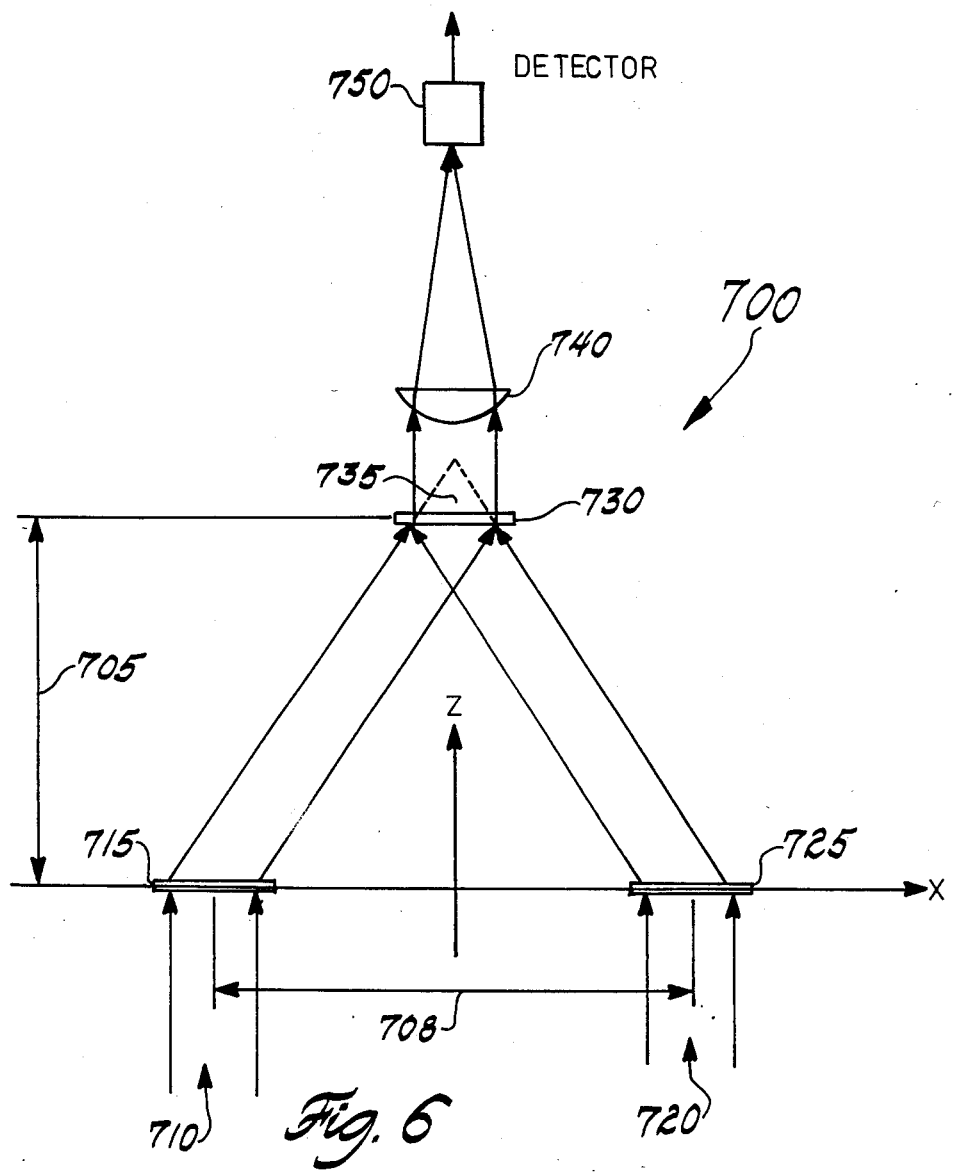
FIG. 6 illustrates the major parts of an optical grating interferometer constructed in accordance with a third preferred embodiment of the present invention.

FIG. 6 illustrates a grating interferometer circuit which may be employed in an optical passive interferometric imaging system to produce the correlated outputs. Grating interferometer circuit 700 includes three diffraction gratings 715, 725 and 730. While these gratings are shown to operate in transmission where light passes through them, those skilled in the art would realize that diffraction gratings operating in reflection could also be employed to practice this aspect of the invention.

The three diffraction gratings 715, 725 and 730 each have the same spatial frequency F. Diffraction gratings 715 and 725 are disposed in parallel in the X plane having a center-to-center distance 708. Two parallel beams 710 and 720 of infrared light from a point source within the area of interest fall upon diffraction gratings 715 and 725. If the area of interest is not in the far field insuring parallel incoming beams, germanium wedges can be placed in front of the diffraction gratings to make beams 710 and 720 parallel. Note that diffraction gratings 715 and 725 are placed in the same plane.

As a result of passing through diffraction grating 715 and 725, the incoming parallel beams of light are diffracted into crossing paths. These crossing paths overlap in an interference fringe box 735. As a consequence of this overlap of the light from parallel beams 710 and 720, an interference pattern occurs within interference fringe box 735.

The third diffraction grating 730 is disposed a distance 705 from the plane of diffraction gratings 715 and 725. Note that this third diffraction grating 730 is placed within the interference fringe box 735. Diffraction grating 730 has the same spatial frequency as diffraction grating 715 and 725. Diffraction grating 730 serves to combine the light beams received from diffraction grating 715 and 725 into a single collimated beam. This single collimated beam is directed to lens 740 which focuses this beam upon detected 750.

Detector 750 differs from the detectors of linear detector arrays 611 and 612 illustrated in FIG. 5. Those detectors within linear detector arrays 611 and 612 were required to generate a microwave output corresponding to the amplitude and phase of the heterodyne signal of the two signals focused thereon. This is because it was necessary to preserve the phase information in order to properly perform the correlation function. However, the correlation function has already been performed in the grating interferometer 700 in the interference fringe box 735. Thus, the output from detector 750 need only be responsive to the magnitude of the light applied thereto. The output of detector 750 corresponds to the output from correlator 525 illustrated in FIG. 4 and correlators 620 illustrated in FIG. 5.

Figure 7:
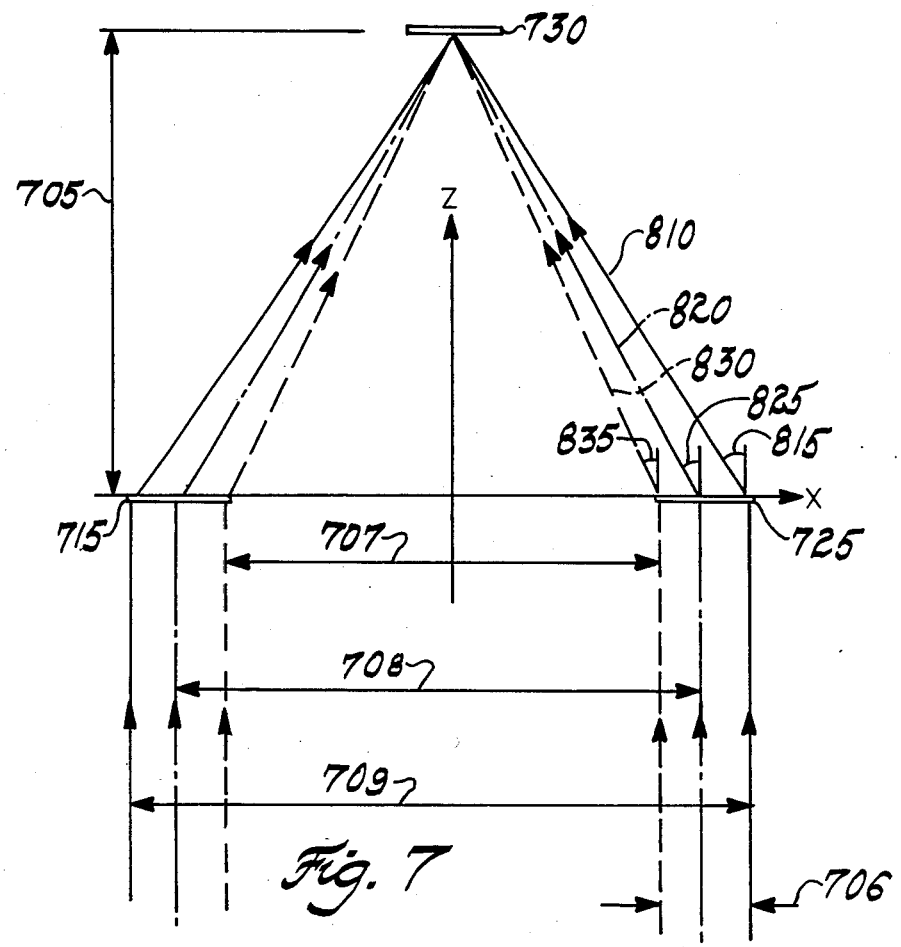
FIG. 7 illustrates the achromaticity over a narrow bandwidth of the grating interferometer illustrated in FIG. 6.

The diffraction grating interferometer 700 illustrated in FIG. 6 is achromatic over a small bandwidth. This can be seen from the following discussion in conjunction with FIG. 7. A plurality of signals on wavelengths $\lambda_1$, $\lambda_2$ and $\lambda_3$ enter the apertures of diffraction gratings 715 and 725. These form respective paths 810, 820 and 830 from diffraction grating 725 to diffraction grating 730. The angles made by the diffraction grating 815, 825 and 835 differ slightly due to the differing wavelengths. In this case, $\lambda_1$ is greater than $\lambda_2$ which is greater than $\lambda_3$. The differing wavelengths arrive at slightly differing separations as denoted in FIG. 8. The intermediate wavelength $\lambda_2$ arrives at a separation 708 which will be designated S and is diffracted by an angle 825. The longer wavelength $\lambda_1$ arrives at a separation 709. This is equal to S+A, where A is the aperture 706 of each diffraction grating. This longer wavelength $\lambda_1$ is diffracted by an angle 815. Similarly, the shorter wavelength $\lambda_3$ arrives at a separation 707 equal to S−A, and is diffracted by an angle 835. Due to the differing diffraction angles and the differing baseline distances, all of these waves arrive at the same point on diffraction grating 703. The wavelengths and angles are such that:

$$\frac{S-A}{1} = \frac{S}{2} = \frac{S+A}{3} \tag{22}$$

This achromaticity can be shown mathmetically as follows. The intensity distribution just prior to diffraction grating 730 caused by the intensity O(a) of a point source r located a distance r from the optical axis Z with the minimum range $R_o$ is given as $$I_G(r) = C\, O(r) \left\{ 1 + \cos\left[ 4\pi F x - \frac{2\pi d}{\lambda}(\sqrt{1-\lambda^2(p+F)^2} - \sqrt{1-\lambda^2(p-F)^2}) \right] \right\} \tag{23}$$

where C is a constant, F is the spatial frequency of the diffraction gratings, x is the location on the X-axis illustrated in FIG. 6, d is the distance 705, and $$p = \frac{\sin(atn(r/R_0))}{\lambda} = \frac{\sin \phi}{\lambda} \quad (24)$$

where $\phi$ is the boresite angle of the area of interest to the diffraction interferometer. Using diffraction grating 730 to recombine the beams diffracted by diffraction gratings 715 and 725 produces a field intensity which is demodulated back to baseband. The intensity distribution right after being diffracted by the diffraction grating 730 is $$I_0(r) = C\, O(r) \left\{ 1 - \cos\left[\frac{2\pi d}{\lambda}\left(\sqrt{1 - \lambda^2 (p + F)^2} - \sqrt{1 - \lambda^2 (p - F)^2}\right)\right]\right\} \quad (25)$$

If the square root terms of equation (23) are expanded into binomial series and only the first order terms are retained, then equation (23) equals approximately $$I_0(r) = C\, O(r) \left[1 - \cos 2\pi\left(\frac{2Fdr}{R_0}\right)\right] \quad (26)$$

In order to obtain the intensity for the entire area of interest it is necessary to integrate $I_0(r)$ over all the points r of the area of interest. This yields an intensity $$I_0 = C \int_{\text{all } r} O(r)\, dr + C \int_{\text{all } r} O(r) \cos(2\pi\omega r)\, dr \quad (27)$$

where $\omega$ is the source spatial frequency $2Fd/R_o$. If third diffraction grating 730 is shifted laterally by $\frac{1}{8}$ of a grating periods the phases of the two fields are shifted by $\pm\pi/4$. Thus a sine transform intensity distribution of the source is formed, where $$I_0 = C \int_{\text{all } r} O(r)\, dr + C \int_{\text{all } r} O(r) \sin(2\pi\omega r)\, dr \quad (28)$$

It can be seen by this equation that the intensity field from the grating interferometer is achromatic to first order. Note that equation (23) from which this relationship is obtained was based on the requirement that the radiating object is in the far field of the two sensors.

Figure 8:
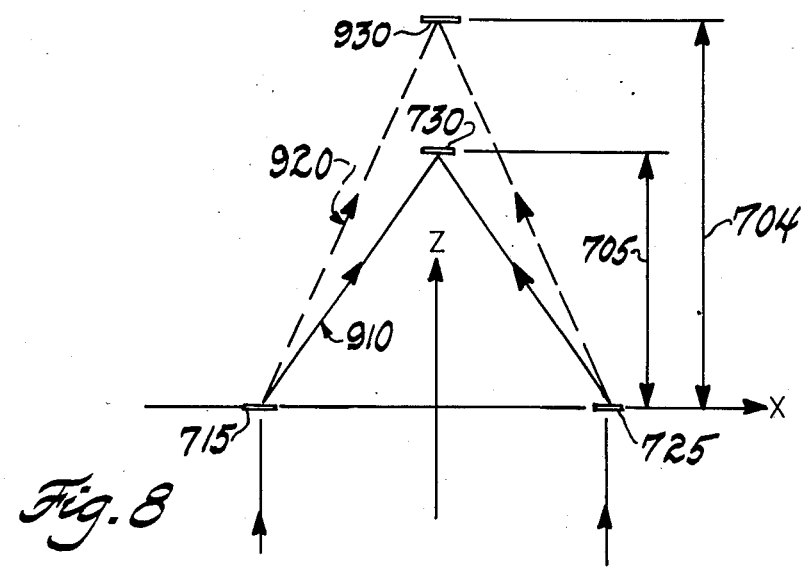
FIG. 8 illustrates the detection of differing frequency bands employing the grating interferometer illustrated in FIG. 6.

For a given F, d and $R_o$ the grating interferometer illustrated in FIG. 6 measures the source spectrum of the area of interest at the spatial frequency $2\pi\omega$. Measurements at differing spatial frequencies can be received at differing distances d (705) along the Z axis thereby producing the synthetic aperture. This is illustrated in FIG. 8. In FIG. 8, diffraction grating 730 is disposed along the Z axis a distance 705 from the plane of diffraction gratings 715 and 725. This receives light waves along path 910 which includes a narrow cluster of frequencies. Diffraction grating 930 is disposed along the Z axis a distance 704 from the plane of diffraction gratings 715 and 725. Diffraction grating 930 receives infrared light along path 920 from diffraction gratings 715 and 725. This position corresponds to smaller angles of diffraction and therefore greater wavelengths. Thus, the cross-correlation of signals from the pair of sensors can be detected in differing narrow frequency bands by disposing a diffraction grating at differing positions on the Z axis.

Referring back to equation (19) it can be seen that the azimuth resolution of the passive interferometric imaging receiver is inversely proportional to the total bandwidth covered. The grating interferometer illustrated in FIG. 6 can achieve aperture fill by bandwidth diversity in a number of ways. Firstly, a single diffraction grating 730 can be employed which moves in the Z axis, thereby taking time integrations of the correlation between the two sensor inputs at differing frequencies. Alternatively, a plurality of diffraction gratings 730 can be disposed within this intereference box for detection at a plurality of frequency bands. In such an event, a mirror behind each diffraction grating could be employed to permit the optical system and the detector to be off axis and thereby minimize the sample spacing. Lastly, a plurality of such diffraction grating detectors can be disposed within the interference box 735 and moved in time, thereby giving a plurality of differing samples of the correlation function over particular narrow bandwidths.

Although the foregoing description of the passive interferometric imaging receiver includes a description of only two sensors mounted on the moving platform having straight line motion, those skilled in the art would recognize that a greater number of sensors may be employed with variations from straight line motion. In the case of the use of a plurality of sensors, a receiver and filter bank must be provided for each sensor. Additional correlators must be provided, preferably enough to form the cross-correlation between the same bandwidth signals for each pair of sensors. It should also be realized that additional variable time delay circuits must also be provided. These additional variable time delay circuits are necessary to steer the response of the plural sensor array to the area of interest in accordance with the principles of synthetic aperture formation. The use of more than two sensors would serve to enhance the aperture fill needed to resolve the image of the area of interest by providing additional angular resolution. Thus each region 30 in the polar coordinate image space would be broadened in the angular dimension or provided with an angularly adjacent counterpart. This would enable the same degree of range resolution with a smaller total angle $\Delta\theta$. In the case of departures from straight line motion, it would be necessary to provide the proper position information for beam steering and for the polar domain formatting for each correlation measure.

We claim:

1. A passive interferometric imaging receiver comprising:
   a pair of sensors disposed on a moving platform along a baseline substantially parallel to the motion of the moving platform, separated by a distance d, each for receiving electromagnetic radiation from an area of interest and generating a received signal proportional to the amplitude and phase of said received electromagnetic radiation;
   a pair of filtering means, each filtering means receiving said received signal from a corresponding one of said sensors, each filtering means for generating a plurality of filtered signals corresponding to the portion of said received signal of said corresponding sensor within a set of predetermined narrow bandwidths;

a plurality of correlation means, each correlation means receiving one of said filtered signals from each of said filtering means for a selected one of said narrow bandwidths, each correlation means for generating a correlation signal representing the correlation of said received signals from said pair of sensors over an interval of time T within said selected narrow bandwidth;

a position indicating means for detecting and indicating the position of the moving platform relative to the area of interest; and a Fourier imaging means connected to said plurality of correlation means and said position indicating means for generating a Fourier transform of said correlation signals over the intervals of time T at positions indicated by said position indicating means thereby forming an image of the area of interest.

2. A passive interferometric imaging receiver as claimed in claim 1, further comprising:

a beam steering means connected to said pair of sensors for continuously steering the main response of said pair of sensors to said area of interest during the motion of the moving platform.

3. A passive interferometric imaging receiver as claimed in claim 2, wherein:

said beam steering means is further connected to said position indicating means for using said position indicated when steering the main response of said pair of sensors.

4. A passive interferometric imaging receiver as claimed in claim 3, wherein:

said beam steering means steers the main response of said pair of sensors to an area of interest having a selected normal range R by calculation of the rate of angular displacement of an area of interest at normal range R from the speed of motion of the moving platform as indicated by said position indicating means.

5. A passive interferometric imaging receiver as claimed in claim 1, further comprising:

a display means connected to said Fourier imaging means for generating a visually perceivable indication of said image of said area of interest.

6. A passive interferometric imaging receiver as claimed in claim 1, wherein:

said Fourier imaging means generates said Fourier transform image of said area of interest by expressing said correlation coefficients and said position information in a polar format wherein the angle coordinate corresponds to the angle made by a line from the midpoint between said sensors to the area of interest with a reference line passing through said area of interest, and the radial coordinate corresponds to the center frequency of the bandwidth of said filtered signals and the separation distance d.

7. A passive interferometric imaging receiver as claimed in claim 1, wherein:

said received electromagnetic radiation comprises thermal radiation.

8. A passive interferometric imaging receiver as claimed in claim 7, wherein:

said filtering means generates said filtered signals corresponding to predetermined narrow bandwidths in the microwave radio band.

9. A passive interferometric imaging receiver as claimed in claim 7, wherein:

said filtering means generates said filtered signals corresponding to predetermined narrow bandwidths in the infrared light band.

10. A passive interferometric imaging receiver system comprising:

a moving platform having a generally straight line of motion with regard to an area of interest;

a pair of sensors disposed on said moving platform along a baseline substantially parallel with said line of motion, said senors separated by a distance d, for receiving electromagnetic radiation from the area of interest and generating a received signal proportional to the amplitude and phase of said received electromagnetic radiation;

a pair of filtering means, each filtering means receiving said received signal from a corresponding one of said sensors, each filtering means for generating a plurality of filtered signals corresponding to the portion of said received signal within respective narrow bandwidths;

a plurality of correlation means, each correlation means receiving one of said filtered signals from each of said filtering means for a selected one of said narrow bandwidths, each of said correlation means for generating a correlation signal representing the correlation of said received signals from said pair of sensors over a time interval T within said selected narrow bandwidth;

a position indicating means for detecting and indicating the position of said moving platform relative to the area of interest; and a Fourier imaging means connected to said plurality of correlation means and said position indicating means for generating a Fourier transform of said correlation coefficients over the time interval T at positions indicated by said position indicating means thereby forming an image of the area of interest.

11. A passive interferometric imaging receiver system as claimed in claim 10, wherein:

said pair of filtering means, said plurality of correlation means, said position indicating means and said Fourier imaging means are disposed on said moving platform.

12. A passive interferometric imaging receiver as claimed in claim 10, further comprising: p1 a beam steering means disposed on said moving platform and connected to said pair of sensors and said position indicating means for using said position indicated by said position indicating means to continuously steer the main response of said pair of sensors to the area of interest during the motion of said moving platform.

13. A passive interferometric imaging receiver as claimed in claim 10, further comprising:

a display means connected to said Fourier imaging means for generating a visually perceivable indication of said image of said area of interest.

14. A passive interferometric imaging receiver as claimed in claim 10, wherein:

said Fourier imaging means generates said Fourier transform image of said area of interest by expressing said correlation coefficients and said position information in a polar format wherein the angle coordinate corresponds to the angle made by a line from the midpoint between said sensors to the area of interest with a reference line passing through said area of interest, and the radial coordinate corresponds to the center frequency of the bandwidth of said filtered signals and the separation distance d.

15. A passive interferometric imaging receiver comprising:

a pair of steerable microwave antenna disposed on a moving platform along a baseline parallel to the motion of the moving platform, each for receiving microwave electromagnetic radiation from an area of interest and generating an electrical signal proportional to the amplitude and phase of said received microwave radiation;

a local oscillator means for generating a local oscillator signal having a predetermined frequency;

a pair of heterodyning means, each connected to a corresponding one of said pair of microwave antennas and to said local oscillator means for heterodyning said electrical signal with said local oscillator signal thereby generating a heterodyne signal;

a pair of filter banks, each filter bank connected to a corresponding one of said heterodyning means and having a plurality of narrow bandpass filters, said narrow bandpass filters having pass bands and center frequencies to provide nonoverlapping coverage of a bandwidth B, each of said pair of filter banks receiving said heterodyne signal from said corresponding heterodyning means and generating a plurality of filtered signals, each filtered signal corresponding to the portion of said heterodyne signal within the narrow bandpass of a corresponding narrow bandpass filter;

a plurality of correlation means, each correlation means receiving said filtered signals from corresponding narrow bandwidth filters of said pair of filter banks, each correlation means for generating a correlation signal representing the correlation of said filtered signals over a time interval T within the corresponding narrow bandwidth;

at least one variable delay means disposed between one of said narrow bandpass filters and the corresponding correlation means having a controllable delay for delaying the corresponding filtered signal;

a position indicating means for detecting and indicating the position of the moving platform relative to the area of interest;

a beam steering means connected to said pair of microwave antenna, said at least one variable delay means and said position indicating means for steering the main response of each said microwave antenna to the area of interest and for controlling said delay of said at least one variable delay means for steering the main response of said pair of microwave antenna to the area of interest; and a Fourier imaging means connected to said plurality of correlation means and said position indicating means for generating a Fourier transform of said correlation signals over the time intervals T at position indicated by said position indicating means thereby forming an image of the area of interest.

16. A passive interferometric imaging receiver as claimed in claim 15, wherein:

said Fourier imaging means includes a polar format transform means connected to said plurality of correlation means and said position indicating means for transforming said correlation signals and said indicated position into polar form wherein the angle coordinate corresponds to the angle made by a line from the midpoint between said microwave antenna to the area of interest with a reference line passing through the area of interest and the radius coordinate corresponds to the center of frequency of the bandwidth of said filtered signals.

17. A passive interferometric imaging receiver as claimed in claim 15, further comprising:

a display means connected to said Fourier imaging means for generating a visually perceivable indication of said image of said area of interest.

18. A passive interferometric imaging receiver comprising:

a coherent light source for generating a pair of identical local oscillator light signals having a plurality of predetermined wavelengths;

a pair of beam combining means, each disposed on a corresponding optical axis and receiving one of said local oscillator light signals from said coherent light source, for combining said local oscillator light signal and light received on the corresponding optical axis;

a pair of diffraction gratings, each receiving combined light from a corresponding beam combining means, for dispersing the plurality of wavelengths of said corresponding local oscillator light signal;

a pair of optical collecting means, each receiving the dispersed combined light from a corresponding diffraction grating, for focusing said dispersed combined light at a corresponding focal plane;

a pair of linear array detector means, each disposed at a corresponding focal plane and including a plurality of detectors, each detector for detecting the heterodyne signal between said light received on a corresponding optical axis and one of said dispersed wavelengths of the corresponding local oscillator light signal at said focal plane and generating a signal corresponding t the amplitude and phase of said detected heterodyne signal;

a pair of filter banks, each filter bank connected to a corresponding one of said linear array detector means and having a plurality of narrow bandpass filters, each detector connected to at least one narrow bandpass filter, said narrow bandpass filters having pass bands and center frequencies to provide nonoverlapping coverage of a bandwidth B, each of said narrow bandpass filters receiving said detected heterodyne signal from a corresponding detector and generating a filtered signal corresponding to the portion of said detected heterodyne signal within the narrow bandpass of said narrow bandpass filter;

a plurality of variable delay means, each receiving the filtered signal of a corresponding narrow bandpass filter and having a controllable delay;

a position indicating means for detecting and indicating the position of the moving platform relative to an area of interest;

a beam-steering means connected to said variable delay means and said positon indicating means for controlling said variable delay of said plurality of variable delay means for steering the main response of said interferometric imaging receiver to light received on said pair of optical axes to the area of interest;

a plurality of correlation means, each correlation means receiving signals from a corresponding pair of vriable delay means filter banks, each correlation means for generating a correlation signal representing the correlation of signals received upon said pair of optical axes over a time interval T within a corresponding narrow bandwidth; and a Fourier imaging means connected to said plurality of correlation means and said position indicating means for generating a Fourier transform of said correlation signals over the time interval T at positions indicated by said position indicating means thereby forming an image of the area of interest.

19. A passive interferometric imaging receiver as claimed in claim 18, wherein:

said Fourier imaging means includes a polar format transform means connected to said plurality of correlation means and said position indicating means for transforming said correlation signals and said indicated position into polar form wherein the angle coordinate corresponds to the angle made by a line from the midpoint between said microwave antenna to the area of interest with a reference line passing through the area of interest and the radial coordinate corresponds to the center frequency of the bandwidths of said filtered signals and the separation of said optical axes.

20. A passive interferometric imaging receiver as claimed in claim 18, further comprising:

a display means connected to said Fourier imaging means for generating a visually perceivable indication of said image of said area of interest.

21. A passive interferometric imaging receiver comprising:

a pair of diffraction gratings, each disposed for receiving light from an area of interest along a corresponding optical axis, each having a spatial frequency F, light diffracted from said diffraction gratings crossing and interfering in an interference fringe box;

at least one detecting diffraction grating disposed within said interference fringe box at a position for receiving diffracted light from each of said pair of diffraction gratings and recombining said diffracted light, having a spatial frequency F;

at least one optical system one corresponding to each detecting diffraction grating disposed for receiving said recombined light from said detecting diffraction grating for directing said recombined light to a focal point;

at least one detector means disposed at said focal point of a corresponding optical system for detecting the light received and generating a detection signal corresponding to the intensity of said interferred light;

a position indicating means for detecting and indicating the position of the moving platform relative to the area of interest;

a Fourier imaging means connected to said at least one detecting means and said position indicating means for generating a Fourier transform of said detector signal of said detecting means over time intervals T at positions indicated by said position indicating means at plural frequency bands thereby forming an image of the area of interest.

22. The passive interferometric imaging receiver as claimed in claim 21, wherein:

said at least one detecting diffraction grating includes a single movable diffraction grating which is movable within said interference fringe box along an axis perpendicular to its surface, said movable diffraction grating sampling and correlating said received light at differing frequency bands depending on the position of said movable diffraction grating.

23. The passive interferometric imaging receiver as claimed in claim 21, wherein:

said at least one detecting diffraction grating includes a plurality of movable diffraction gratings each disposed along an axis perpendicular to their surfaces and movable within said interference fringe box along said axis, each of said movable diffraction gratings sampling and correlating said received light at differing frequency bands depending on the position of said movable diffraction gratings.

24. The passive interferometric imaging receiver as claimed in claim 21, wherein:

said at least one detecting diffraction grating includes a plurality of diffraction gratings each disposed at a fixed position within said interference fringe box, each of said detecting diffraction grating sampling and correlating said received infrared light at differing frequency bands.

25. A passive interferometric imaging receiver as claimed in claim 21, wherein:

said Fourier imaging means includes a polar format transform means connected to said plurality of correlation means and said position indicating means for transforming said correlation signals and said indicated position into polar form wherein the angle coordinate corresponds to the angle made by a line from the midpoint between said optical receiving means to the area of interest with a reference line passing through the area of interest and the radial coordinate corresponds to the center frequency of said filtered signals and the separation of said optical axes.

26. A passive interferometric imaging receiver as claimed in claim 21, further comprising:

a display means connected to said Fourier imaging means for generating a visually perceivable indication of said image of said area of interest.

27. A passive interferometric imaging receiver comprising:

a plurality of sensors disposed on a moving platform along a baseline substantially parallel to the motion of the moving platform, each sensor for receiving electromagnetic radiation from an area of interest and generating a received signal proportional to the amplitude and phase of said received electromagnetic radiation;

a plurality of filtering means, each filtering means receiving said received signal from a corresponding one of said sensors, each filtering means for generating a plurality of filtered signals corresponding to the portion of said received signal of said corresponding sensor within a set of predetermined narrow bandwidths;

a plurality of correlation means, each correlation means receiving one of said filtered signals from each of a selected pair of filtering means for a selected one of said narrow bandwidths, each correlation means for generating a correlation signal representing the correlation of said received signals from said selected pair of sensors over an interval of time T with said selected narrow bandwidth;

a position indicating means for detecting and indicating the position of the moving platform relative to the area of interest;

a Fourier imaging means connected to said plurality of correlation means and said position indicating means for generating a Fourier transform of said correlation signals over the intervals of time T at positions indicated by said position indicating means thereby forming an image of the area of interest.

28. A passive interferometric imaging receiver as claimed in claim 27, further comprising:
a beam steering means connected to said plurality of sensors for continuously steering the main lobe of the synthetic aperature antenna including said plurality of sensors to said area of interest during the motion of the moving platform.

29. A passive interferometric imaging receiver as claimed in claim 27, further comprising:
a display means connected to said Fourier imaging means for generating a visually perceivable indication of said image of said area of interest.

30. A passive interferometric imaging receiver as claimed in claim 27, wherein:
said Fourier imaging means generates said Fourier transform image of said area of interest by expressing said correlation coefficients and said position information in a polar format wherein the angle coordinate corresponds to the angle made by a line from the midpoint between said sensors to the area of interest with a reference line passing through said area of interest, and the radius coordinate corresponds to the center frequency of the bandwidth of said filtered signals.

* * * * *

UNITED STATES PATENT AND TRADEMARK OFFICE
CERTIFICATE OF CORRECTION

PATENT NO. : 4,794,395  
DATED : December 27, 1988  
INVENTOR(S) : Cindrich et al Page 1 of 4

It is certified that error appears in the above-identified patent and that said Letters Patent is hereby corrected as shown below:

Column 3, line 66, "$\hat{r}.r$" should be --$r \cdot \hat{r}$--.

Column 5, line 8 (equation 9), "$\overline{F}$" (second occurrence) should be --$\hat{F}$--.

Column 5, line 17, "$r_1$" should be --$\hat{r}_1$--.

Column 5, line 17, "$r_2$" should be --$\hat{r}_2$--.

UNITED STATES PATENT AND TRADEMARK OFFICE
CERTIFICATE OF CORRECTION

PATENT NO. : 4,794,395  
DATED : December 27, 1988  
INVENTOR(S) : Cindrich et al Page 2 of 4

It is certified that error appears in the above-identified patent and that said Letters Patent is hereby corrected as shown below:

Column 6, line 46 (equation 16), $$"\frac{1}{B_r \cos} = \frac{c}{4 \sin \frac{\alpha}{2} \sin \frac{\theta}{2} \cos}"$$

should be $$--\frac{1}{B_r \cos \gamma} = \frac{\lambda_c}{4 \sin \frac{\alpha}{2} \sin \frac{\Delta\theta}{2} \cos \gamma}--.$$

Column 6, line 55 (equation 17), "$f_c$" (first occurrence) should be --$f_0$--.

Column 7, line 4 (equation 21), $$"\rho x = \frac{\lambda_c r_0^2}{SVT \cos}"$$ should be $$--\rho_x = \frac{\lambda_c r_0^2}{SVT \cos \gamma}--$$

Column 11, line 27, "approachs" should be --approaches--.

UNITED STATES PATENT AND TRADEMARK OFFICE
CERTIFICATE OF CORRECTION

PATENT NO. : 4,794,395  
DATED : December 27, 1988  
INVENTOR(S) : Cindrich et al Page 3 of 4

It is certified that error appears in the above-identified patent and that said Letters Patent is hereby corrected as shown below:

Column 12, line 64 (second line of equation 23), $$\text{``}\frac{2\pi d}{\lambda}\left(\sqrt{1-\lambda^2(p-F)^2}-\sqrt{1-\lambda^2(p-F)^2)}\right]\right\}\text{''}$$

should be $$\text{--}\frac{2\pi d}{\lambda}\left(\sqrt{1-\lambda^2(p+F)^2}-\sqrt{1-\lambda^2(p-F)^2}\right)\right]\right\}\text{--}.$$

Column 13, line 18 (second line of equation 25), $$\text{``}\cos\left[\frac{2\pi d}{\lambda}\left(\sqrt{1-\lambda^2(p-F)^2}-\sqrt{1-\lambda^2(p-F)^2)}\right]\right\}\text{''}$$

should be $$\text{--}\cos\left[\frac{2\pi d}{\lambda}\left(\sqrt{1-\lambda^2(p+F)^2}-\sqrt{1-\lambda^2(p-F)^2}\right)\right]\right\}\text{--}.$$

UNITED STATES PATENT AND TRADEMARK OFFICE
CERTIFICATE OF CORRECTION

PATENT NO. : 4,794,395

DATED : December 27, 1988

INVENTOR(S) : Cindrich et al

Page 4 of 4

It is certified that error appears in the above-identified patent and that said Letters Patent is hereby corrected as shown below:

Column 18, line 36, "t" should be --to--.

Column 18, line 66, "vriable" should be --variable--.

Signed and Sealed this

Ninth Day of April, 1991

Attest:

HARRY F. MANBECK, JR.

Attesting Officer

Commissioner of Patents and Trademarks